(12) United States Patent
Zank

(10) Patent No.: US 10,804,927 B2
(45) Date of Patent: Oct. 13, 2020

(54) SIGNAL TRANSMISSION DEVICE FOR PULSE DENSITY MODULATED SIGNALS

(71) Applicant: Knick Elektronische Messgeräte GmbH & Co. KG, Berlin (DE)

(72) Inventor: Harald Zank, Berlin (DE)

(73) Assignee: Knick Elektronische Messgeräte GMBH & CO. KG, Berlin (DE)

( * ) Notice: Subject to any disclaimer, the term of this patent is extended or adjusted under 35 U.S.C. 154(b) by 0 days.

(21) Appl. No.: 16/485,910

(22) PCT Filed: Feb. 8, 2018

(86) PCT No.: PCT/EP2018/053172
§ 371 (c)(1),
(2) Date: Aug. 14, 2019

(87) PCT Pub. No.: WO2018/149728
PCT Pub. Date: Aug. 23, 2018

(65) Prior Publication Data
US 2020/0044661 A1 Feb. 6, 2020

(30) Foreign Application Priority Data
Feb. 15, 2017 (DE) .......................... 10 2017 202 406

(51) Int. Cl.
*H03M 3/00* (2006.01)
*G06F 3/0354* (2013.01)
(52) U.S. Cl.
CPC ........... *H03M 3/324* (2013.01); *H03M 3/458* (2013.01); *G06F 3/0354* (2013.01)

(58) Field of Classification Search
CPC ...... H03M 3/324; H03M 3/458; G06F 3/0354
(Continued)

(56) References Cited

U.S. PATENT DOCUMENTS 10,523,190 B2* 12/2019 Costa ..................... H03K 7/04
10,547,478 B2* 1/2020 Jang ..................... H04B 10/508
(Continued)

FOREIGN PATENT DOCUMENTS

| DE | 4239850 C2 | 6/1994 |
| DE | 102011075182 A1 | 12/2011 |
| DE | 102014109956 A1 | 1/2015 |

*Primary Examiner* — Brian K Young
(74) *Attorney, Agent, or Firm* — Browdy and Neimark, PLLC

(57) ABSTRACT

A signal transmission device for pulse density modulated signals comprises a signal input for an input signal with a defined maximum signal value, a modulation stage for generating a pulse density modulated transmission signal out of the input signal, a locking device at the input for the pulse density modulated transmission signal to overwrite same with a static fault signal, a pulse reconstructing transmission path for the pulse density modulated transmission signal, a demodulation stage at the output, for reconstructing the input signal out of the transmitted pulse density modulated transmission signal, and a signal change monitoring device capturing the pulse density modulated transmission signal of the transmission path at the output, which has an error signal output for signaling the detection of a missing dynamic pulse density modulated transmission signal on the transmission path due to the static fault signal.

16 Claims, 1 Drawing Sheet

(58) Field of Classification Search
USPC .......................................................... 341/157
See application file for complete search history.

(56) References Cited

U.S. PATENT DOCUMENTS

| | | | |
|---|---|---|---|
| 10,646,164 B1 * | 5/2020 | Perryman | ................ A61B 5/72 |
| 2015/0176962 A1 | 6/2015 | Kerdraon et al. | |
| 2016/0285290 A1 | 9/2016 | Takei et al. | |

* cited by examiner

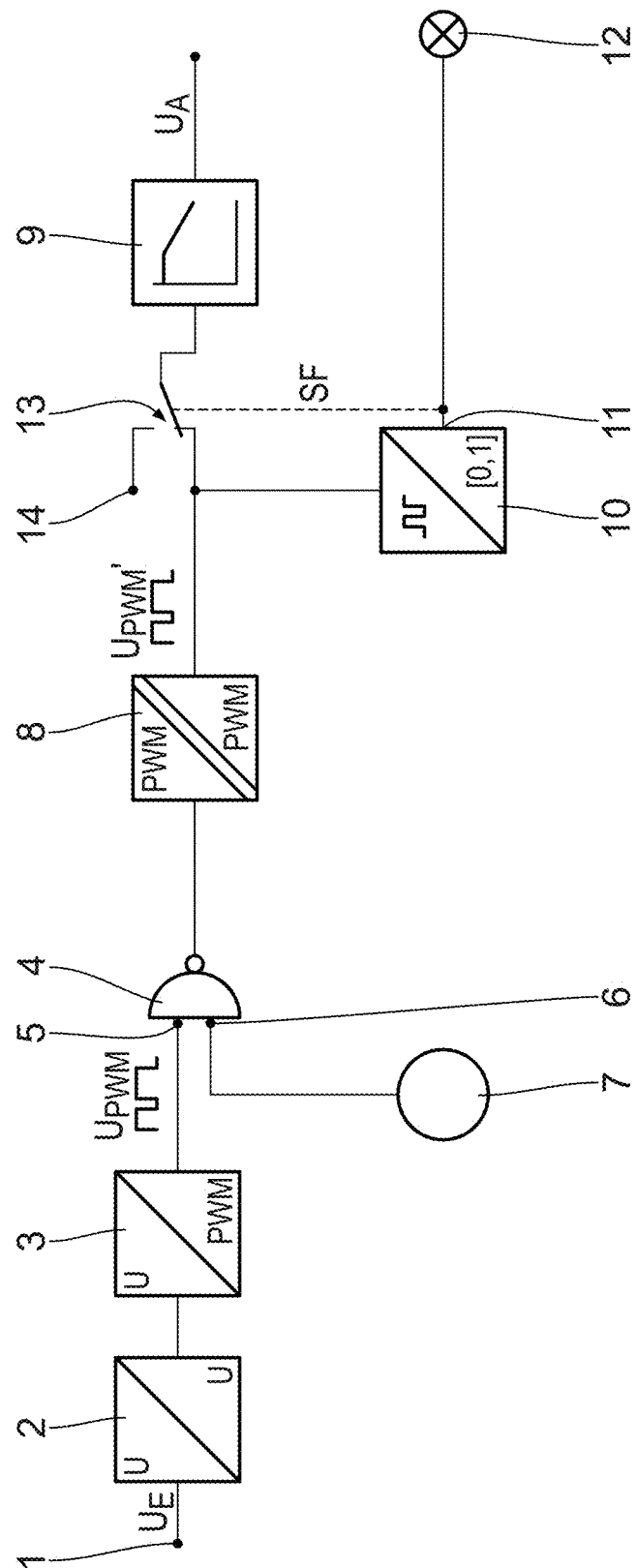

SIGNAL TRANSMISSION DEVICE FOR PULSE DENSITY MODULATED SIGNALS

CROSS-REFERENCES TO RELATED APPLICATIONS

This application claims the priority of German Patent Application, Serial No. DE 10 2017 202 406.2, filed on Feb. 15, 2017, pursuant to 35 U.S.C. 119(a)-(d), the content of which is incorporated herein by reference in its entirety as if fully set forth herein.

FIELD OF THE INVENTION

The invention relates to a signal transmission device for pulse density modulated signals.

BACKGROUND OF THE INVENTION

Before the actual invention is addressed, its background has to be examined shortly for the sake of better understanding. For instance, on the one hand, in the context of signal transmission, a pulse code modulated transmission is basically known, in which a continuous-time and continuous-value analog signal is transcribed and transferred into a discrete-time and discrete-value signal. In many fields of electrical engineering, on the other hand, however, analog signal quantities are transformed into not pulse code modulated square wave signals, since this signal form, in comparison to the analog transmission, proves as particularly robust against transmission failures or distortions. In addition, the generation can be realized in a quasi-analog manner (e.g. without using a micro controller), with discrete components. A reconstruction of the analog signal out of the not pulse code modulated square-wave signal is generally carried out by means of low-pass filtering.

Such not pulse code modulated signals are also named as pulse density modulated signals. The most important examples for corresponding modulation types are pulse width modulation and Sigma-Delta modulation.

The known basic components of signal transmission devices for such pulse density modulated signals are a signal input for an analog input signal, a modulation stage at the input side for generating a pulse density modulated transmission signal out of the input signal, a pulse reconstructing transmission path for the pulse density modulated transmission signal, as well as a demodulation stage at the output side for reconstructing the input signal out of the pulse density modulated transmission signal.

This setup, for example, is reflected in DE 42 39 850 C2, which discloses a circuitry for controlling and monitoring a power regulator for a battery charger, which is controlled by an electronic processor. The power regulator is connected with an interface, which is coupled with the processor via an optical link. Via the corresponding optical conductor of the optical link, PWM signals are transmitted, wherein different ranges of the duty ratio of these PWM signals are considered for a regular signal transmission or an interfering signal transmission. This signalizing function has nothing to do with the actual signal transmission.

From DE 10 2011 075 182 A1, a device for the transmission of pulse density modulated signals is known, in which error signals are communicated via a logic to a PWM circuit. In the case of an error, a signal is generated, which induces the PWM circuit to bring its output signals into a defined state.

Basically, in the transmission of pulse density modulated signals, there is the problem that the generated signal, in contrast to digital signal formats, has no (hierarchical) data structure or the like. Therefore, a transmission of additional, e.g. binary, signals as well as the implementation of a signal integrity check (such as e.g. a CRC check) are not possible.

SUMMARY OF THE INVENTION

Accordingly, an object of the invention is to further improve a signal transmission device such that the indication of a signal causing an error message via a quasi-analog pulse density modulated transmission path as well as a simple signal integrity check of the signal transmission device are provided.

This object is achieved by the inventive signal transmission device for pulse density modulated signals. Accordingly, the signal transmission device, besides the basic components already cited above, is further characterized by the following qualities:

the analog input signal is limited to a defined maximum signal value, wherein the input modulation range of the modulation stage at the input side is higher by a difference signal value than this defined maximum signal value of the input signal, a locking device arranged downstream of the modulation stage at the input side, for the pulse density modulated transmission signal, in order to overwrite same with a static fault signal, as well as a signal change monitoring device capturing the pulse density modulated transmission signal of the transmission path at the output of same, which signal change monitoring device has an error signal output for signaling the detection of a missing dynamic pulse density modulated transmission signal on the transmission path due to the static fault signal.

Due to the defined maximum signal value, it is achieved that there is no failure of the pulse density modulated signals at the output of the transmission device during the regular practical operation of the transmission device, due to the difference signal value to the maximum input modulation range. Thus, for the defined signal range of the transmission device, a value of the duty ratio of the transmission signal of 0% or 100% is never achieved. Due to the locking device, then, in the case of a fault, a targeted locking of the pulse density modulated transmission signals is achieved at the input side, which for example is feasible by a simple logic gate. The latter generates a static high or low signal as a fault signal. Subsequently, at the output side, it can be captured with the help of the signal change monitoring device whether the dynamic pulse density modulated signals, common in the regular operation, or a static signal indicating a state of error are provided.

In the dependent claims, preferred extensions of the signal transmission device according to the invention are indicated. Accordingly, the limitation of the input signal to the maximum signal value can be realized due to an amplitude limiter at the input side in a simpler and more reliable manner with regard to circuitry.

According to an extension of the invention, the signal transmission device, in case of a corresponding configuration of the modulation stage at the input side and of the demodulation stage at the output side, is especially suitable for processing pulse width modulated (PWM) or Sigma- Delta modulated signals, which are both typical examples of pulse density modulated signal transmission methods.

In a manner known per se, the locking device can be configured by a monitoring device at the input side, preferably in the form of a watchdog circuit controlled by a micro controller. Thus, additionally, for example the function of the micro controller itself can be monitored and errors on same as well as on circuit parts, which are monitored by the micro controller, can be signalized.

In a manner also known per se, the pulse reconstructing transmission path can be configured by a galvanically isolated pulse transformer, such as preferably a high voltage pulse transformer. With the help of the invention, correspondingly, this electronic standard device can be upgraded functionally.

With regard to circuitry, a simple and at the same time reliable configuration of the signal change monitoring device at the output side is provided due to the use of a retriggerable monoflop.

Alternatively, the signal change monitoring device can also be configured by an alternating voltage coupling of the transmission signal by means of a capacitor and (one way) rectification via a diode and a charging capacitor, wherein a parallel connection of a resistor towards the charging capacitor is provided for the implementation of a time constant of the monitoring device.

Further dependent claims describe alternatives for the recovery of the error signal available at the error signal output of the signal change monitoring device. This signal, for example, can be configured binarily and for instance serve for actuating an optical error display in the form of an indicator lamp, or be transmitted to a downstream monitoring or signal processing device.

Alternatively or additionally, a failure indication device, which can be activated by the error signal, can be arranged downstream of the error signal output of the signal change monitoring device, providing a defined, preferably standardized error message signal at the output side of the signal transmission. A typical example of such an error message signal is a current signal of 0 mA in a 4 . . . 20 mA Live-Zero standardized signal transmission device or of 28 mA in a 20 mA standardized signal transmission device. Due to this, the signal transmission device according to the invention can be integrated in a common industrial measuring environment without any problems.

Further features, details and advantages of the invention arise from the following description of an embodiment with reference to the attached drawing.

BRIEF DESCRIPTION OF THE FIGURE

FIG. 1 shows a block diagram of a signal transmission device according to the invention.

DESCRIPTION OF THE PREFERRED EMBODIMENT

As can be seen from the drawing, the signal transmission device has a signal input 1, via which an input signal $U_E$ to be transmitted is input. Downstream of the signal input 1, an amplitude limiter 2 is arranged, which ensures that the input signal $U_E$ is limited for the further processing in the circuit to a maximum signal value $U_{Emax}$, which is smaller by a difference signal value $\Delta U$ than the maximum modulation signal value $U_R$ of a modulation stage 3 arranged downstream of the amplitude limiter 2 at the input side. Thus, it is provided that:

$$|U_{Emax}| \Leftarrow |+/-(U_R - \Delta U)|$$

The modulation stage 3, for example, in a common manner generates a pulse width modulated (PWM) square wave transmission signal $U_{PWM}$ out of the input signal $U_E$. Due to the signal processing before the modulation stage 3, therefore, it is ensured during the regular operation that the dynamic PWM transmission signal $U_{PWM}$, via the maximum modulation range of the input signal $U_E \Leftarrow U_{Emax}$ has a duty ratio differing from 0% or 100%, i.e. for example of 10% to 90%.

The modulation stage 3 is followed by a locking device 4, which can be a simple CMOS logic gate. One input 5 of same is connected with the modulation stage 3, whereas the second input 6 is coupled with a µC controlled monitoring device 7. Due to this, at its output, either the PWM transmission signal $U_{PWM}$ for the error-free normal operation or a static fault signal $U_{STAT}$, for example in the form of a logical 0, can be output in case the monitoring device 7, in its function as a watchdog circuit at the input side of the signal transmission device, has detected an error on the monitored circuit parts or with itself.

The locking device 4 is then followed by the actual pulse reconstructing transmission path 8, which, in the form of a high voltage isolation amplifier, transmits the PWM transmission signal $U_{PWM}$ in galvanically isolated form to the output side of the signal transmission device, for example by an inductive pulse transmission. There, it is available as a transmission signal $U_{PWM}'$, out of which in the demodulation stage 9 arranged downstream, the output signal $U_A$ corresponding to the input signal $U_E$ is reconstructed in a common manner.

For the detection of an error state signalized from the input side, the PWM transmission signal $U_{PWM}'$ at the output side is monitored by a signal change monitoring device, which in the embodiment shown is a retriggerable monoflop. This monitoring device 10 captures whether it is the dynamic PWM transmission signal $U_{PWM}'$ which is pending or whether it is a static state of stress corresponding to the static fault signal $U_{STAT}$. In the latter case, due to the missing dynamic PWM transmission signals $U_{PWM}'$, a corresponding binary error signal $S_F$ is output at an error signal output 11 of the monitoring device 10, with the help of which, for example, an LED warning light 12 is actuated and thus it is signalized that no regular input signals $U_E$ are transmitted, but that there is a fault state.

The binary error signal $S_F$—as it is not shown in further detail—can also be processed further in a monitoring and signal processing device arranged downstream.

For the integration of this error message in a common industrial measuring environment, in the embodiment shown in FIG. 1, a failure indication device 13 is provided, which can be activated by the signal change monitoring device 10 with the help of its error signal $S_F$. This is indicated by dashed lines in the drawing. As soon as such an error signal $S_F$ is pending, an error current signal $I_F$ of 0 mA is applied at a message output 14 of the failure indication device 13, which can be further processed in an analog manner in a standardized 4 . . . 20 mA-Live-Zero standardized signal transmission device, not shown in further detail.

Summing up, the present arrangement allows for the monitoring of circuit parts and micro controllers as well as for the provision of an error signal without the aid of a (further) micro controller and without a further electrically isolating signal transmission path, which is undesirable in a high voltage isolation amplifier, since it generally increases the failure probability as well as downgrades the interference resistance/EMC resistance and similar electronic parameters by parasitic effects, such as for example additional parasitic capacities, considerably.

The invention claimed is:

1. A signal transmission device for pulse density modulated signals, comprising
    a signal input (1) for an input signal ($U_E$) with a defined maximum signal value ($U_{Emax}'$),
    a modulation stage (3) at the input side for the generation of a pulse density modulated transmission signal ($U_{PWM}$) out of the input signal ($U_E$), wherein the input modulation range ($U_R$) of the modulation stage (3) at the input side is higher by a difference signal value ($\Delta$) than the limited maximum signal value ($U_{Emax}$) of the input signal ($U_E$),
    a locking device (4), arranged downstream of the modulation stage (3) at the input side, for the pulse density modulated transmission signal ($U_{PWM}$), in order to overwrite same with a static fault signal ($U_{STAT}$),
    a pulse reconstructing transmission path (8) for the pulse density modulated transmission signal ($U_{PWM}$),
    a demodulation stage (9) at the output side, for the reconstruction of the input signal ($U_E$) out of the transmitted pulse density modulated transmission signal ($U_{PWM}'$),
    a signal change monitoring device (10) capturing the pulse density modulated transmission signal ($U_{PWM}'$) of the transmission path (8) at the output of same, which has an error signal output (11) for signaling the detection of a missing dynamic pulse density modulated transmission signal ($U_{PWM}'$) on the transmission path (8) due to the static fault signal ($U_{STAT}$).

2. The signal transmission device according to claim 1, comprising an amplitude limiter (2) arranged at the input side to limit the analog input signal ($U_E$) to the maximum signal value ($U_{Emax}'$).

3. The signal transmission device according to claim 1, wherein the modulation stage (3) arranged at the input side and the demodulation stage (9) arranged at the output side are configured for processing pulse density modulated or Sigma-Delta modulated transmission signals ($U_{PWM}'$).

4. The signal transmission device according to claim 1, wherein the locking device (4) is configured as a logic gate for generating a static high or low signal as a fault signal ($U_{STAT}$).

5. The signal transmission device according to claim 1, wherein the locking device (4) can be activated by a monitoring device (7).

6. The signal transmission device according to claim 1, wherein the locking device (4) can be activated by a monitoring device (7) which is controlled by a micro controller.

7. The signal transmission device according to claim 1, wherein the pulse reconstructing transmission path (8) is configured by a galvanically isolated pulse transformer.

8. The signal transmission device according to claim 1, wherein the pulse reconstructing transmission path (8) is configured by a high voltage pulse transformer.

9. The signal transmission device according to claim 1, wherein the signal change monitoring device (10) is configured as retriggerable monoflop.

10. The signal transmission device according to claim 1, wherein the signal change monitoring device (10) is configured by an alternating voltage coupling of the transmission signal by means of a capacitor and (one way) rectification via a diode and a charging capacitor, wherein a parallel connection of a resistor towards the charging capacitor is provided for the implementation of a time constant of the monitoring device.

11. The signal transmission device according to claim 1, wherein a binary error signal ($S_F$) is available at the error signal output (11) of the signal change monitoring device (10).

12. The signal transmission device according to claim 11, wherein the binary error signal ($S_F$) is configured for actuating an error display (12) or for being transmitted to a monitoring and signal processing device arranged downstream.

13. The signal transmission device according to claim 11, wherein the binary error signal ($S_F$) is configured for actuating an optical error display (12) or for being transmitted to a monitoring and signal processing device arranged downstream.

14. The signal transmission device according to claim 1, wherein the error signal output (11) of the signal change monitoring device (10) is coupled with a failure indication device (13), which can be activated by the error signal ($S_F$), for generating a defined error message signal ($I_F$) at the output side of the signal transmission.

15. The signal transmission device according to claim 1, wherein the error signal output (11) of the signal change monitoring device (10) is coupled with a failure indication device (13), which can be activated by the error signal ($S_F$), for generating a standardized error message signal ($I_F$) at the output side of the signal transmission.

16. The signal transmission device according to claim 15, wherein the standardized error message signal is a current signal ($I_F$) of 0 mA in a 4 . . . 20 mA Live-Zero standardized signal transmission device or of 28 mA in a 20 mA standardized signal transmission device.

* * * * *